United States Patent [19]
Fee

[11] Patent Number: 5,943,352
[45] Date of Patent: Aug. 24, 1999

[54] EXTERNAL CAVITY LASER WITH OPTICALLY SWITCHED TUNING MECHANISM

[75] Inventor: John Fee, Plano, Tex.

[73] Assignee: MCI Communication Corporation, Washington, D.C.

[21] Appl. No.: 08/823,945

[22] Filed: Mar. 25, 1997

[51] Int. Cl.[6] .......................................... H01S 3/13
[52] U.S. Cl. ................... 372/32; 372/23; 372/33; 372/34; 372/38; 372/108
[58] Field of Search .................... 372/23, 29, 32, 372/33, 34, 38, 108

[56] References Cited

U.S. PATENT DOCUMENTS

| | | | |
|---|---|---|---|
| 5,528,612 | 6/1996 | Schepws et al. | 372/23 |
| 5,541,946 | 7/1996 | Scheps et al. | 372/23 |

OTHER PUBLICATIONS

Glance et al;"Fast Optical Packet switching Based On WDM";IEEE Photonics Technology Letters, vol.4,No. 10, Oct. 1992.

Glance et al;"Fast Optical packet Switching Based on WDM";IEEE Photonics Technology Letters; vol.6,No.1, Oct. 1992,pp. 1186–1188.

Ishida et al;"Fast and Stable Frequency Switching Employing a Delayed/self–Duplex (DSD) Liight Source";IEEE Photonics Technology Letters vol.6,No.1,Jan. 1994,pp. 13–15.

*Primary Examiner*—Leon Scott, Jr.

[57] ABSTRACT

A stable switched multifrequency source is described. The stable switched multifrequency source includes a narrow-band reflective optical filter bank. This bank includes a plurality of narrowband reflective optical filter devices. In one embodiment, the stability and precision of the reflectivity of the narrowband reflective optical filter devices is further enhanced through regulation via temperature and/or bias current based on a comparison of the output wavelength and a precise stable wavelength reference. The stable switched multifrequency source also includes an optical switch that is coupled to each of the narrowband reflective optical filter devices.

28 Claims, 8 Drawing Sheets

EXTERNAL CAVITY LASER WITH OPTICALLY SWITCHED TUNING MECHANISM

BACKGROUND OF THE INVENTION

FIELD OF THE INVENTION

The present invention relates generally to lasers, and more particularly to a laser switching mechanism.

RELATED ART

A semiconductor laser device is a device that generates a light beam using a laser diode and two or more reflective devices. The light beam, also referred to as a signal, generated by the semiconductor laser device may be used for carrying information in an optical communications system.

Wavelength division multiplexing is used to allow multiple lasers to be coupled together and operate on a common fiber. Wavelength division multiplexing allows an increase in the number of signals that may be carried over the same medium using multiple lasers, each operating at a different carrier frequency. On a wavelength division multiplexing system, 200 nanometers (nm) of bandwidth is typically available. This allows a considerable number of signals to be carried on a fiber system. Because each signal that is carried must have a separate carrier frequency, each signal must have a separate laser. As a result, each laser on a fiber system must be operating at a different carrier frequency within the 200 nm range. If single frequency lasers are used, frequency selection and availability are established when the fiber system is built. If a laser is to be added to a fiber system, the laser that is added must operate at a different frequency than the other lasers that are already on that system in order to enable another signal to be simultaneously carried on the fiber.

A telecommunications network contains many different fiber systems that carry information over great distances. If the fiber systems use lasers that each operate at one frequency, then a large surplus of lasers is needed to have the capability to add a new carrier to the telecommunications network. In addition, a telecommunications network that contains fiber systems built with single frequency lasers has limited capability to restore traffic if a path is cut because spare lasers must be available at the same frequency on both the chosen restoration path and on the path to be restored so the legs can be connected to establish a complete path around the cut.

Attempts at addressing the problems discussed above have involved replacing the single frequency laser with a laser that can be tuned to multiple frequencies. With a tunable laser, adding a carrier to a fiber system in a telecommunications network would require merely tuning the laser to the selected carrier frequency rather than searching through spare lasers hoping to find a laser at the desired frequency. In addition, restoration is possible by tuning the laser on the path to be used for restoration to match the frequency of the laser on the path to be restored.

However, tunable lasers that are currently available are limited in tuning range and cannot tune over the full 200 nm bandwidth available on a wavelength division multiplexing system. Early lasers including the Fabry-Perot cavity laser, the Distributed Feedback laser, and the single section Distributed Bragg Region laser had the capability for tuning within only a limited range, often less than 2 nm. Using the more advanced two, three and four section Distributed Bragg Region lasers typically yields no more than 9 nm of tuning but some may go up to 30 nm. The most promising tuning laser is the phase-matched laser diode which achieves a 57 nm tuning range.

In addition, many current tunable lasers must sweep through the range of frequencies between the frequency the laser is set at and the desired frequency. Often the tuning mechanism is cumbersome to maneuver. The result is that tuning may take time and inaccuracies may occur during the tuning process.

Yet another problem with current technology is that available reflective devices do not provide a highly accurate reflected frequency. For example, a reflected device that is supposed to reflect at the color red may instead reflect some shades of pink or orange. A lack of stability in reflection will alter the frequency of the emitted signal. A stable frequency source is desirable to ensure that the lasers do not interfere with each other and to protect the integrity of the wavelength throughout communications.

SUMMARY OF THE INVENTION

Briefly stated, the present invention is directed to a switchable laser that can quickly and accurately switch to any designated wavelength or frequency within the entire usable bandwidth of an optical fiber. In addition, the present invention does not require sweeping across the range of wavelengths or frequencies in moving from one wavelength or frequency to another. Furthermore, the present invention offers high accuracy in reflected frequency because the reflective medium used is very stable.

More particularly, the present invention is directed to a switchable laser source that uses a bank of narrowband reflective optical filters to control an external cavity laser. The narrowband reflective optical filters are coupled to the laser through an optical switch. The optical switch selects which narrowband reflective optical filter is coupled to the laser and achieves very fast switching to an approximate channel frequency. Numerous narrowband reflective optical filters are used to enable tuning within substantially the entire bandwidth of the fiber, currently 200 nm. Narrowband optical filters, such as gratings, are extremely stable frequency sources that allow for continuity of control.

The present invention eases restoration and addition of carriers to a fiber. With the present invention, adding a carrier to a fiber system in a telecommunications network requires merely tuning a spare laser to the selected carrier frequency. As the present invention is able to switch to any designated wavelength or frequency within the entire usable bandwidth of an optical fiber, the task of searching through spare lasers hoping to find a laser at the desired frequency is eliminated. In addition, restoration is possible by tuning the laser on the path to be used for restoration to match the frequency of the laser on the path to be restored. Also, disruption caused by sweeping across the range of wavelengths between the set wavelength and the desired wavelength is avoided. Furthermore, the stable reflective medium offers an accurate output wavelength or frequency.

Further features and advantages of the invention, as well as the structure and operation of various embodiments of the invention, are described in detail below with reference to accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to accompanying drawings,wherein.

DETAILED DESCRIPTION OF THE PREFERRED EMBODIMENTS

Figure 1:
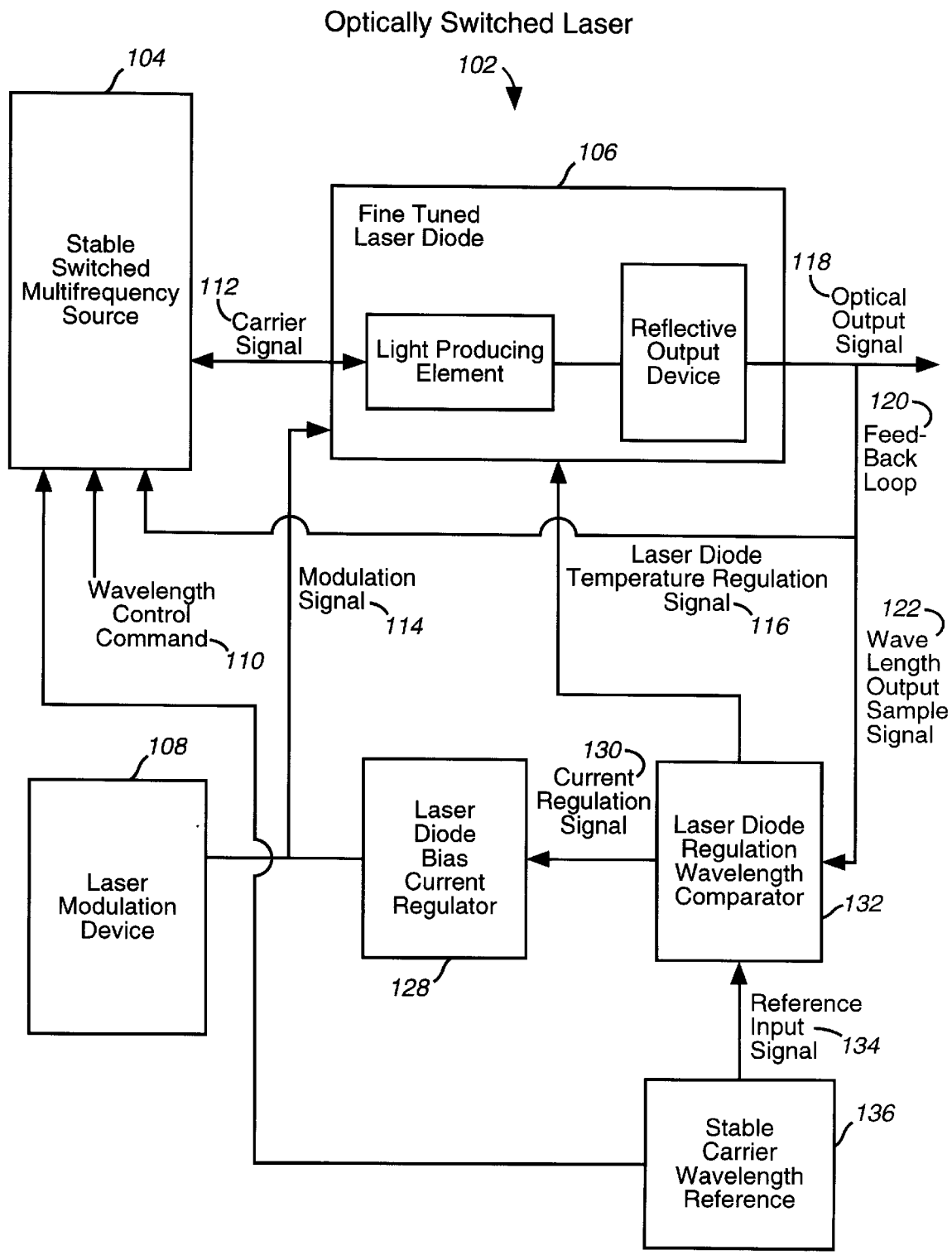
FIG. 1 is a block diagram of an optically switched laser according to a preferred embodiment of the present invention.

FIG. 1 is a block diagram of an optically switched laser 102. The optically switched laser 102 produces a modulated optical output signal 118 at a selected carrier frequency. More specifically, the optically switched laser 102 accepts a wavelength control command 110 (also called a frequency selection command) that identifies a desired carrier frequency and produces a light beam or optical signal at that desired carrier frequency. The initial signal produced is referred to as a carrier signal 112. The optically switched laser 102 described in the preferred embodiment also modulates the carrier signal 112 and produces a modulated carrier signal, referred to in FIG. 1 as the optical output signal 118. However, various embodiments of the invention are possible that do not include this modulation capability.

Figure 2:
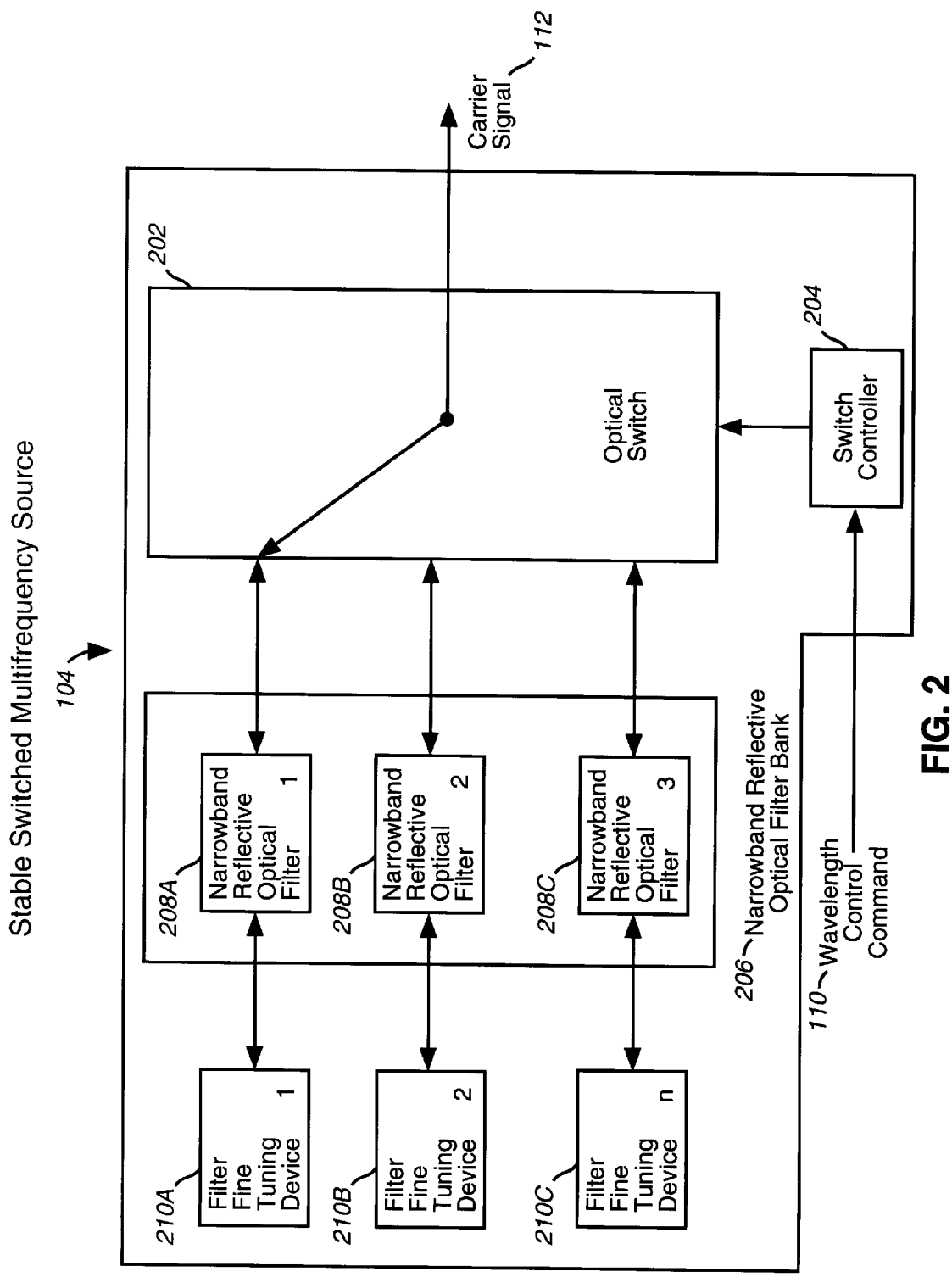
FIG. 2 is a block diagram of a stable switched multifrequency source that forms part of the optically switched laser of FIG. 1 according to a preferred embodiment of the present invention.

The optically switched laser 102 in FIG. 1 includes a stable switched multifrequency source 104, a fine tuned laser diode 106, a laser modulation device 108 and elements for fine tuning the fine tuned laser diode 106. The stable switched multifrequency source 104 accepts a wavelength control command 110 that identifies a desired carrier frequency. As described in detail below, the stable switched multifrequency source 104 has a number of optical filters 208 (FIG. 2). Each of the optical filters 208 resonates at a particular frequency. The stable switched multifrequency source 104 selects the optical filter 208 corresponding to the desired carrier frequency specified in the wavelength control command 110.

The stable switched multifrequency source 104 is coupled to the fine tuned laser diode 106. The fined tuned laser diode 106 includes a light producing element 124 that generates light. The light generated by the light producing element 124 is reflected by a reflective output device 126 in the fine tuned laser diode 106 to the stable switched multifrequency source 104. The light is reflected back and forth between the selected filter 208 in the stable switched multifrequency source 104 and the reflective output device 106. This light reflecting back and forth represents the carrier signal 112. The selected optical filter 208 causes the frequency of the carrier signal 112 to be equal to, or at least substantially equal to, the desired carrier frequency specified in the wavelength control command 110. This reflection action results in intensifying the carrier signal 112. Once the carrier signal 112 becomes sufficiently intense, the carrier signal 112 is modulated and then output from the fine tuned laser diode 106 as the optical output signal 118.

In the preferred embodiment shown in FIG. 1, the laser modulation device 108 is coupled to the fine tuned laser diode 106. The laser modulation device 108 sends a modulation signal 114 to the fine tuned laser diode 106. As described above, the fine tuned laser diode 106 modulates the carrier signal 112 using the modulation signal 114 to produce the optical output signal 118.

The fine tuned laser diode 106 in the preferred embodiment shown in FIG. 1 is fine tuned in part by a wave length error signal 116 which is used to adjust the temperature of the fine tuned laser diode 106. The fine tuning involves a wavelength comparison process using a reference input signal 134 and a sample of the optical output signal 118, which is referred to as the wavelength output sample signal 122. The wavelength output sample signal 122 is received by the laser diode regulation wavelength comparator 130 via a feedback loop 120.

Also included in the optically switched laser 102 are fine tuning components including a laser diode bias current regulator 128, a laser diode regulation wavelength comparator 132, and a precise stable carrier wavelength reference 136. The laser diode bias current regulator 128 is coupled to the laser modulation device 108 to provide adjustments in current into the laser diode 106. The laser diode bias current regulator 128 adjusts the amplitude of the current of the fine tuned laser diode 106 which alters the frequency of the optical output signal 118. The laser diode regulation wavelength comparator 132 sends information to the laser diode bias current regulator 128 and the fine tuned laser diode 106 for fine tuning. The laser diode regulation wavelength comparator 132 does this by comparing the output of the fine tuned laser diode 106 to a reference input signal 134 from a precise stable carrier wavelength reference 136. The laser diode regulation wavelength comparator 132 compares these two signals and sends the results to the laser diode bias current regulator 128 and the fine tuned laser diode 106.

The precise stable carrier wavelength reference 136 is a stable, highly accurate source of the carrier frequency produced by the stable switched multifrequency source 104. The function of a precise stable carrier wavelength reference 136 is similar to that of an atomic clock, to provide a stable, highly accurate reference that regulates equipment in the telecommunications network. A precise stable carrier wavelength reference 136 exists for each of the frequencies that may be produced by the stable switched multifrequency source 104.

FIG. 2 is a block diagram of the stable switched multifrequency source 104. As discussed above, the stable switched multifrequency source 104 accepts a wavelength control command 110 that identifies a selected carrier frequency and causes the light that is emitted from the fine tuned laser diode 106 to be at the selected carrier frequency. The stable switched multifrequency source 104 comprises an optical switch 202, a switch controller 204, a narrowband reflective optical filter bank 206 including a plurality of narrowband reflective optical filters 208, and a plurality of filter fine tuning devices 210. Each of the filter fine tuning devices 210 corresponds to one of the narrowband reflective optical filters 208. The optical filters 208 correspond to particular frequencies. More particularly, each optical filter 208 resonates light at a particular frequency. The optical filter bank 206 includes an optical filter 208 for each frequency of interest (for example, for each frequency of interest within the 200 nm bandwidth of a wavelength division multiplexing system.) Additional frequency capacity can be added at any time by adding optical filters 208 tuned at the appropriate frequencies.

Narrowband reflective optical filters 208 may be implemented using well known fixed gratings. Fixed gratings are advantageous as they have very specific resonant wavelengths or frequencies. Therefore, light reflecting from a fixed grating will reflect at a frequency very close to the tuned frequency of the selected fixed grating. In addition, fixed gratings are highly reflective, close to 99%, which is close to the reflectivity of a mirror. High reflectivity enables the grating to efficiently and effectively reflect light back through the optical switch 202 to the reflective output device 126 of the fine tuned laser diode 106.

Although filter fine tuning devices 210 are not necessary to the operation of the stable switched multifrequency source 104, the embodiment shown in FIG. 2 includes filter fine tuning devices 210. Each of the filter fine tuning devices 210 is coupled to one of the narrowband reflective optical filters 208. The filter fine tuning device 210A adjusts the temperature of the narrowband reflective optical filter 208A which causes the narrowband reflective optical filter 208A to reflect the light closer to its tuned frequency. More details on the filter fine tuning devices are given below.

The switch controller 204 accepts the wavelength control command 110. The terms wavelength and frequency are interchangeable because frequency is the inverse of wavelength. These terms will be used interchangeably herein. The switch controller 204 commands the optical switch 202 to switch to the optical filter 208 corresponding to the selected carrier frequency (as indicated by the wavelength control command 110). The switch controller 204 can be either located with the optical switch 202 or located remotely from the optical switch 202.

The optical switch 202 is preferably implemented using well known switchable optical waveguide technology or other devices having optical switching ability. Switchable optical waveguide technology includes electrooptic switches, for example Mach-Zehnder switches, and well known magnetooptic switches.

Figure 3:
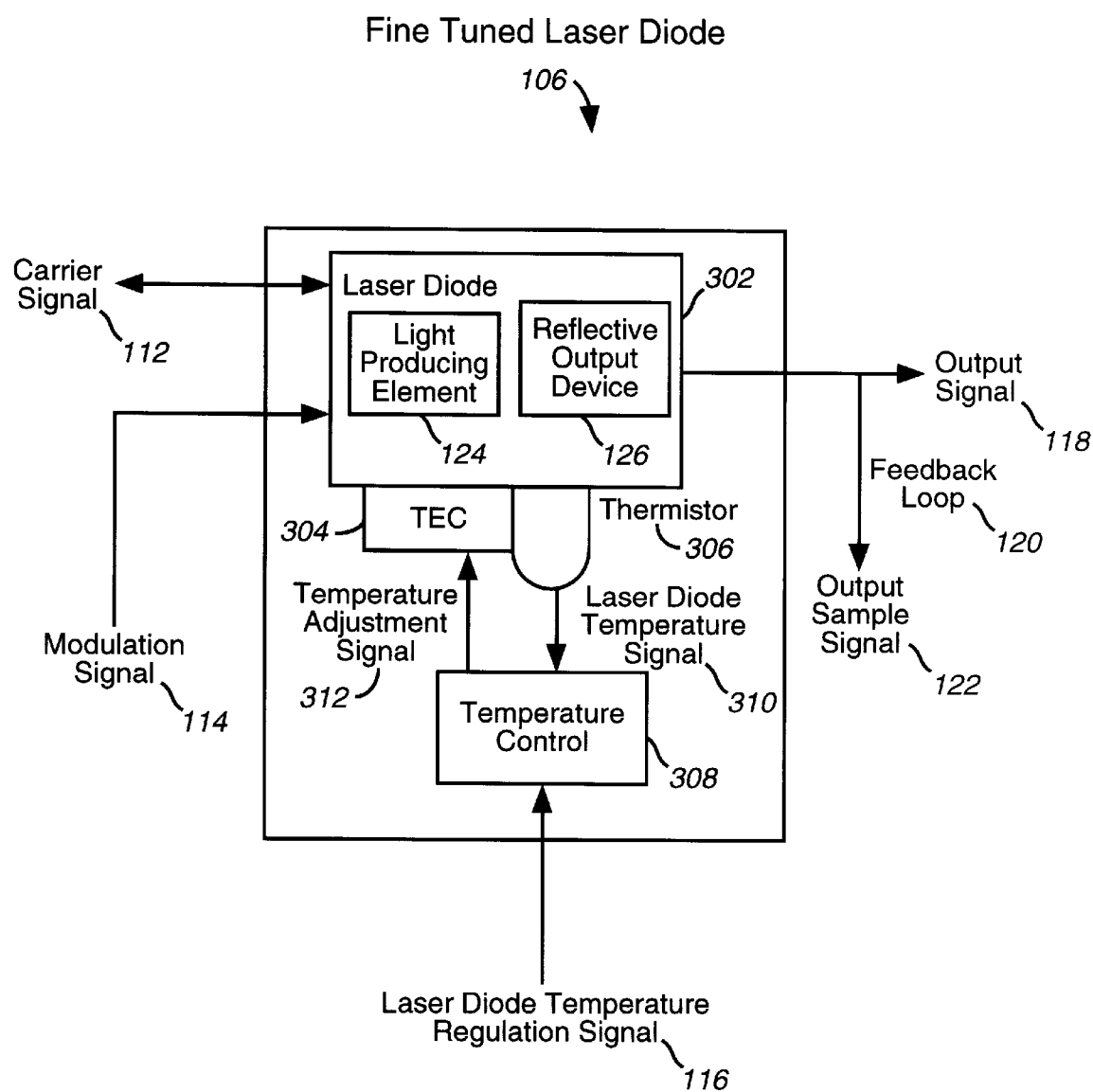
FIG. 3 is a block diagram of a laser diode device that forms part of the optically switched laser of FIG. 1 according to a preferred embodiment of the present invention.

FIG. 3 is a block diagram of the fine tuned laser diode 106. The fine tuned laser diode 106 includes a laser diode 302, a thermo electric cooler 304 (also referred to as a TEC), a thermistor 306, and a temperature control 308. The laser diode 302 includes the light producing element 124 and the reflective output device 126. The thermistor 306 is a device that measures the temperature of the laser diode 302. As discussed above, the light producing element 124 and the reflective output device 126 allow the laser diode 302 to interact with the stable switched multifrequency source 104 to produce an intense beam of light. The fine tuning elements of the fine tuned laser diode 106 are the thermo electric cooler 304, the thermistor 306, and the temperature control 308. The thermo electric cooler 304 and the thermistor 306 are coupled to the laser diode 302 and the temperature control 308 and interact with these devices to adjust the temperature of the laser diode 302. By adjusting the temperature of the laser diode 302, it is possible to fine tune the frequency of the light being reflected by the reflective output device 126.

Figure 6:
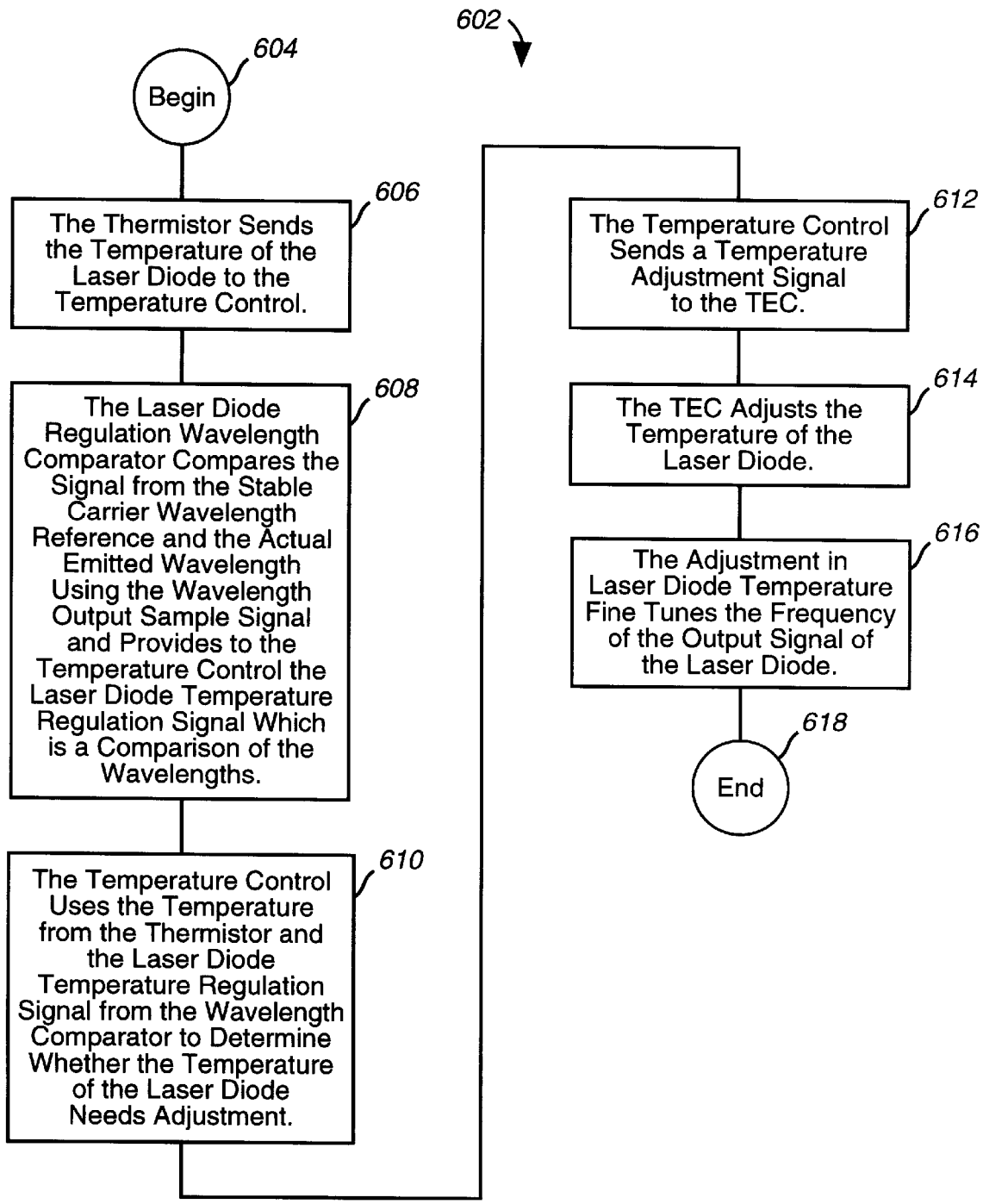
FIG. 6 is a flowchart illustrating the operation of the laser diode of FIG. 3 according to perferred embodiment of the present invention.

FIG. 6 is a flowchart 602 which illustrates in more detail the operation of the fine tuned laser diode 106. When describing the steps of FIG. 6, the components shown in FIG. 3 will be referenced. In step 606, the thermistor 306 sends a laser diode temperature signal 310 to the temperature control 308. The thermistor 306 measures the temperature of the laser diode 302. The laser diode temperature signal 310 is the measurement of the temperature of the laser diode 302.

In step 608, the laser diode regulation wavelength comparator 132 (FIG. 1) compares the highly accurate signal 134 from the precise stable carrier wavelength reference 136 and the actual emitted wavelength using the wavelength output sample signal 122 and provides to the temperature control 308 the wavelength error signal 116 which is a comparison of the wavelengths of these two signals.

In step 610, the temperature control 308 uses the laser diode temperature signal 310 from the thermistor 306 and the wavelength error signal 116 from the laser diode regulation wavelength comparator 130 to determine whether the temperature of the laser diode 302 needs adjustment.

The temperature adjustments made by the temperature control 308 are servient to the adjustments in current made by the laser diode bias current regulator 128. In other words, the laser diode bias current regulator 128 determines adjustments in current first and then the temperature control 308 makes adjustments based on the adjustments in current made by the laser diode bias current regulator 128. Communication between the temperature control 308 and the laser diode bias current regulator 128 limits adjustments to those needed. The communication between the laser diode bias current regulator 128 and the temperature control 308 is via a feedback circuit (not shown) connecting the two devices.

In step 612, the temperature control 308 sends a temperature adjustment signal 312 to the thermo electric cooler 304. The temperature adjustment signal 312 provides the thermo electric cooler 304 with information needed to adjust the temperature of the laser diode 302.

In step 614, the thermo electric cooler 304 adjusts the temperature of the laser diode 302. If the temperature adjustment signal 312 indicates that the temperature of the laser diode is too high to provide the desired frequency optical output signal 118, the thermo electric cooler 304 will cool the laser diode 302.

In step 616, the adjustment in laser diode temperature fine tunes the frequency of the output signal 118 of the laser diode 302.

Figure 4:
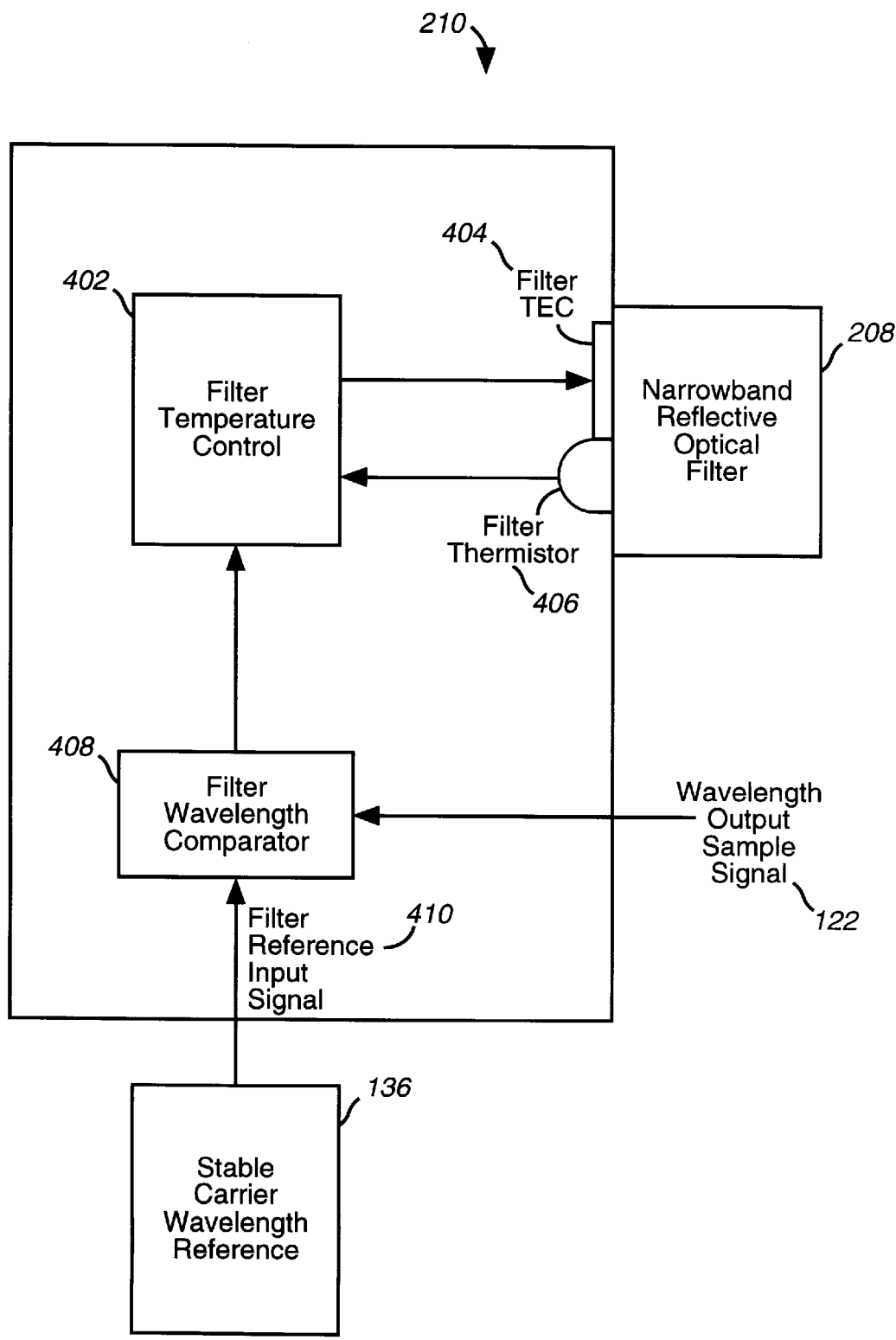
FIG. 4 is a block diagram of a filter fine tuning device that firms part of the stable switched multifrequency source of FIG. 2 according to a preferred embodiment of the present invention.

FIG. 4 is a block diagram of a filter fine tuning device 210. The filter fine tuning device 210 comprises a filter temperature control 402, a filter thermo electric cooler 404, a filter thermistor 406, and a filter wavelength comparator 408. The fine tuning elements of the filter fine tuning device 210 are similar to those of the fine tuned laser diode 106. Similar to the thermistor 306 that measures the temperature of the laser diode 302, the filter thermistor 406 measures the temperature of the narrowband reflective optical filter 208. The filter thermo electric cooler 404 and the thermistor 406 are coupled to the narrowband reflective optical filter 208 and the filter temperature control 402 and interact with these devices to adjust the temperature of the narrowband reflective optical filter 208. By adjusting the temperature of the narrowband reflective optical filter 208, it is possible to fine tune the frequency of the light it reflects.

Figure 7:
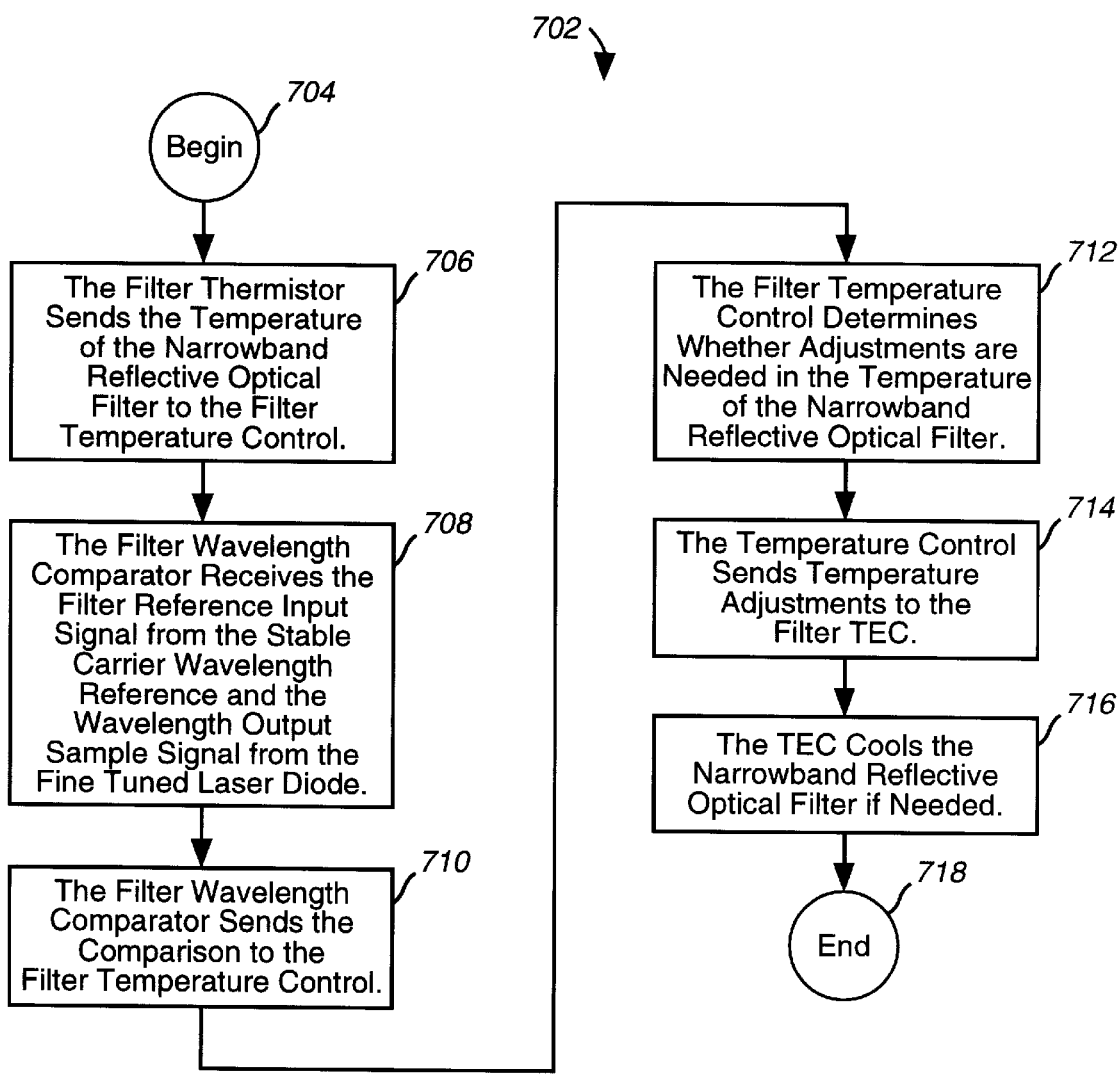
FIG. 7 is a flowchart illustrating the operation of the filter fine tuning device of FIG. 4 according to a preferred embodiment of the present invention.

FIG. 7 is a flowchart 702 which illustrates in more detail the operation of the filter fine tuning device 210. When describing the steps of FIG. 7, the components shown in FIG. 4 will be referenced. In step 706, the filter thermistor 406 sends the temperature of the narrowband reflective optical filter 208 to the filter temperature control 402.

In step 708, the filter wavelength comparator 408 receives the filter reference input signal 410 from the precise stable carrier wavelength reference 136 and the wavelength output sample signal 122 from the fine tuned laser diode 106 (FIG. 1).

In step 710, the filter wavelength comparator 408 compares the wavelengths of the wavelength output sample signal 122 and the filter reference input signal 410 and then sends the resulting comparison to the filter temperature control 402.

In step 712, the filter temperature control 402 determines whether adjustments are needed in the temperature of the narrowband reflective optical filter 208 based on the comparison signal received from the filter wavelength comparator 408.

In step 714, the filter temperature control 402 sends temperature adjustments to the filter thermo electric cooler 404.

In step 716, the filter thermo electric cooler 404 cools the narrowband reflective optical filter 208 if needed.

Figure 5A:
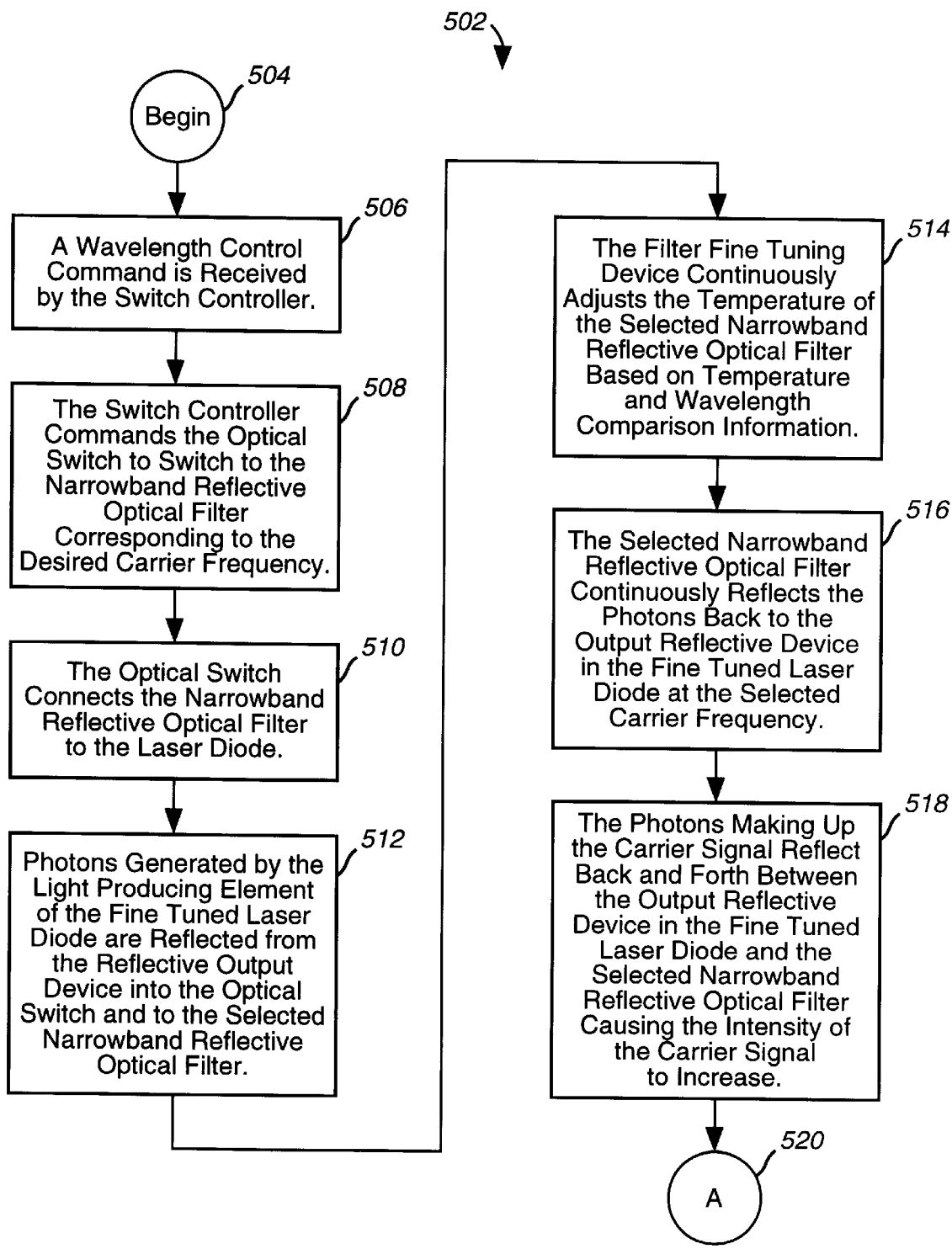
FIGS. 5A and 5B collectively depict a flowchart illustrating the operation of the optically switched laser of FIG. 1 according to a preferred embodiment of the present invention.
Figure 5B:
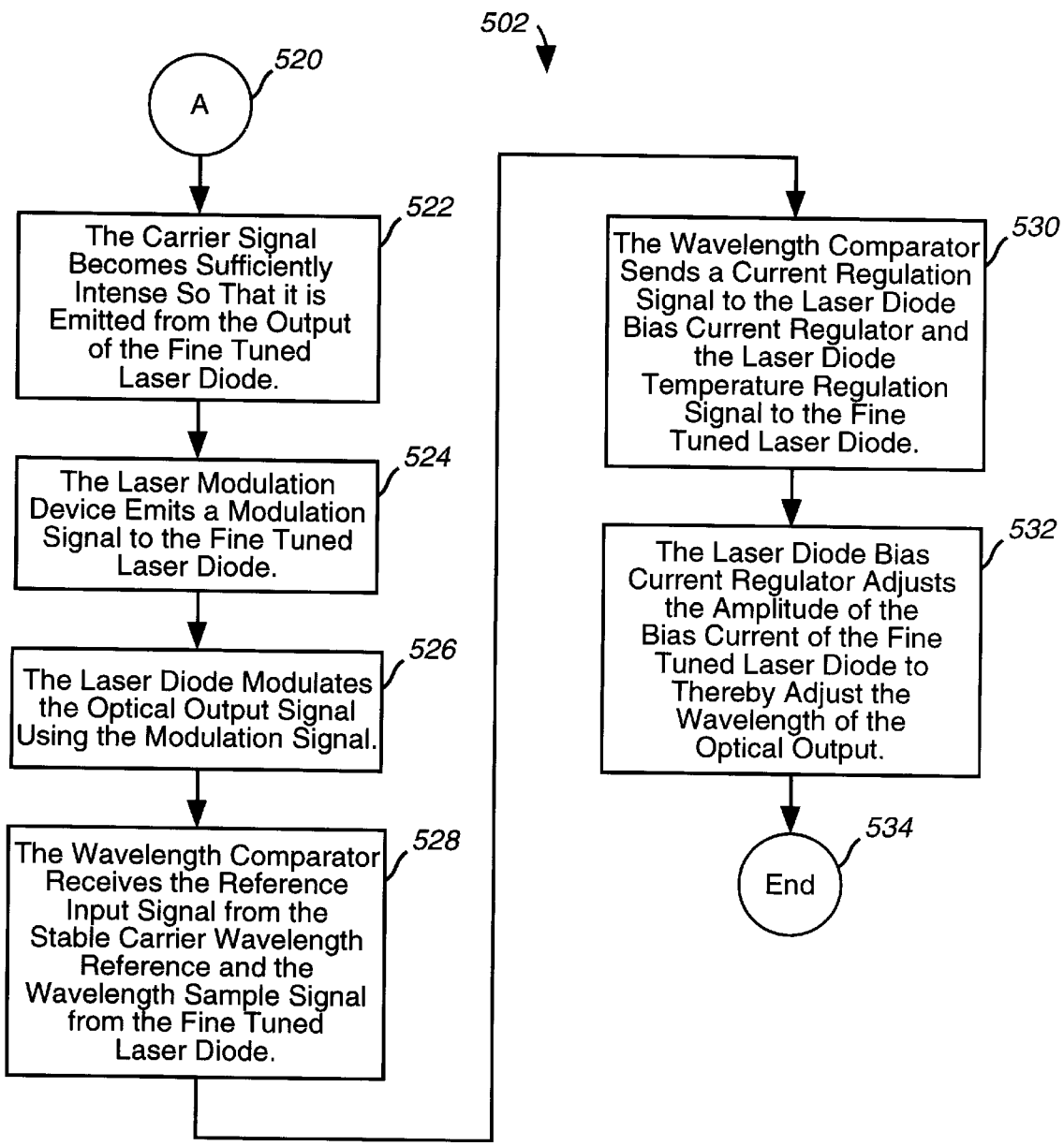

The operation of the optically switched laser 102 is illustrated in a flowchart 502 shown in FIGS. 5A and 5B. When describing the steps shown in FIGS. 5A and 5B, the components of FIG. 1 and FIG. 2 will be referenced.

In step 506, the switch controller 204 receives the wavelength control command 110, which indicates the desired carrier frequency.

In step 508, the switch controller 204 commands the optical switch 202 to switch to the optical filter 208 corresponding to the desired carrier frequency. Assume that optical filter 208A corresponds to the desired carrier frequency.

In step 510, the optical switch 202 connects the narrowband reflective optical filter 208A to the laser diode 106 in accordance with the commands from the switch controller 204.

As represented by step 512, photons generated by the light producing element 124 of the fine tuned laser diode 106 are continuously reflected from the reflective output device 126 of the fine tuned laser diode 106 into the optical switch 202 and to the selected narrowband reflective optical filter 208A.

As represented by step 514, the filter fine tuning device 210A continuously adjusts the temperature of the selected narrowband reflective optical filter 208A based on temperature and wavelength comparison information. This causes the selected narrowband reflective optical filter 208A to reflect light even more accurately at the selected carrier frequency.

As represented by step 516, the selected narrowband reflective optical filter 208A continuously reflects the photons back to the output reflective device 126 in the fine tuned laser diode 106 at the selected carrier frequency. The photons at the selected carrier frequency are also referred to as the carrier signal 112.

As represented by step 518, the photons making up the carrier signal 112 continuously reflect back and forth between the output reflective device 126 in the fine tuned laser diode 106 and the selected narrowband reflective optical filter 208A causing the intensity of the carrier signal 112 to increase.

In step 522, the carrier signal 112 becomes sufficiently intense so that it is emitted as the optical output signal 118 from the output of the fine tuned laser diode 106.

As represented by step 524, the laser modulation device 108 continuously emits a modulation signal 114 to the fine tuned laser diode 106.

In step 526, the laser diode modulates the optical output signal 118 using the modulation signal 114.

In step 528, the laser diode regulation wavelength comparator 132 receives the reference input signal 134 from the precise stable carrier wavelength reference 136 and the wavelength output sample signal 122 from the fine tuned laser diode 106 and compares the wavelengths.

In step 530, the laser diode regulation wavelength comparator 132 sends a wavelength error signal 116, which is a comparison of the wavelengths, to the laser diode bias current regulator 128 and the wavelength error signal 116, which is also a comparison of the wavelengths, to the fine tuned laser diode 106.

In step 532, the laser diode bias current regulator 128 determines whether adjustments are needed in the laser diode bias current. If so, the laser diode bias current regulator 128 adjusts the amplitude of the bias current of the fine tuned laser diode 106 to thereby adjust the wavelength of the optical output signal 118. The adjustment in the amplitude of the bias current of the fine tuned laser diode 106 alters the frequency of the optical output signal 118.

As mentioned previously, the adjustments in current made by the laser diode bias current regulator 128 dominate the adjustments made by the temperature control 308. In other words, the laser diode bias current regulator 128 determines adjustments in current first and then the temperature control 308 adjusts the temperature based on the adjustments in current made by the laser diode bias current regulator. Communication between the laser diode bias current regulator 128 and the temperature control 308 limits changes to those needed. The communication between the laser diode bias current regulator 128 and the temperature control 308 is via a feedback circuit (not shown) connecting the two devices. The laser diode bias current regulator 128 dominates because current adjustments are limited to the allowable range of current that can be used to operate the fine tuned laser diode 106. If current outside of the allowable range is provided to the fine tuned laser diode 106, the fine tuned laser diode 106 may malfunction.

Other embodiments of the present invention are possible. As mentioned above, referring to FIG. 1, another embodiment of the invention includes the stable switched multifrequency source 104 and the fine tuned laser diode 106 but does not include the laser modulation device 108 or the fine tuning elements. The fine tuning elements of FIG. 1 include the laser diode regulation wavelength comparator 132, the laser diode bias current regulator 128, and the precise stable carrier wavelength reference 136. In this embodiment, the optical output signal 118 is the same as the carrier signal 112. This embodiment is useful whenever a tunable laser source is needed. For example, a color television could use tunable laser light sources in each pixel in the color television screen that change color for each new picture displayed on the television screen.

Additional embodiments are possible that do not include the filter fine tuning devices 210 shown in FIG. 2 or the fine tuning devices for the laser diode including the thermo electric cooler 304, the thermistor 306, and the temperature control 308 shown in FIG. 3. These embodiments might not have the frequency accuracy of the embodiment described above, but would be less expensive to manufacture. Also, embodiments of the invention are possible that use other devices that improve the accuracy of the signal.

Still more embodiments are possible with the addition of components. For example, referring to FIG. 1, an alternative embodiment includes a plurality of fine tuned laser diode devices 106 each coupled to the stable switched multifrequency source 104 and the laser modulation device 108. This embodiment would broadcast the carrier signal 112 to many recipients via the multiple optical output signals 118. Still another embodiment would include multiple laser modulation devices 108, each coupled to one of a plurality of fine tuned laser diode 106 generating different optical output signals 118 all with the same carrier frequency 112. All of the embodiments involving modulation are possible with a direct modulator 108, as shown in FIG. 1, an indirect modulator, or any other modulation technique known to those skilled in the art.

Referencing FIG. 2, further embodiments are possible with multiple elements in the stable switched multifrequency source 104. For example, a device may be manufactured to have multiple narrowband reflective optical filter banks 206 to increase the availability of precise colors, ease repair and replacement of parts, and have a spare source available. Similarly, an embodiment is possible with multiple optical switches 202 that allows switching among multiple laser devices 106 (FIG. 1) and allows a spare switch to be available. Another embodiment with multiple optical switches 202 is a device that works with different types of light sources. In addition, an embodiment may be to have multiple switched multifrequency sources 104 in one device which has the advantages described above, increased availability of precise colors, ease of maintenance, possibility of switching among multiple and different types of light sources, and spare parts.

The stable switched multifrequency source 104 may be made to have enhanced command capability. Multiple switch controllers 204 or one advanced switch controller (an embodiment of 204) allow the optical switch 202 to be controlled in various ways such as automated or manual control. Additional elements can be added to the stable switched multifrequency source 104 to add control and manageability. For example, the optical switch 202 may be controlled by an automated device that includes a database that stores the narrowband reflective optical filters 208 available and in use. The information can be used to either manually or automatically control the optical switch 202.

Other embodiments involving multiple elements in the stable switched multifrequency source 104 may allow the device to operate in various conditions. For example, an embodiment with multiple filter fine tuning devices 210 for each desired carrier frequency may allow the stable switched multifrequency source to operate in extreme climates, such as extremely hot or cold environments. These filter fine tuning devices 210 may have components that warm the device or better cool the device. Embodiments that include multiple filter fine tuning devices 210 and/or multiple narrowband reflective optical filters 208 for each desired carrier frequency may have advantages of being capable of operating under various conditions, may have improved performance with various types of light sources, and may allow spares to be available. To reduce manufacturing cost, a device may have a filter fine tuning device 210 for several narrowband reflective optical filters 208.

While various embodiments of the present invention have been described above, it should be understood that they have been presented by way of example only, and not limitation. Thus, the breadth and scope of the present invention should not be limited in any of the above-described exemplary claims and their equivalents.

What is claimed is:

1. An optically switched multiple output laser device capable of being switched between a plurality of frequencies to generate at least one output signal at a selected frequency, the device comprising:

at least one switchable multifrequency source for providing a reference corresponding to the selected frequency, the source comprising;
a plurality of wavelength select reflective devices; and
at least one optical switch having purity of ports each coupled to one of said plurality of wavelength selective reflective devices, wherein said optical switch receives a command signal to select one of said plurality of ports thereby determining which of said reflective devices is to be used as the reference for the source to generate the selected frequency; and
a plurality of laser devices, each coupled to said source for generating the plurality of frequencies.

2. The optically switched multiple output laser device of claim 1, further comprising:

a modulation device coupled to each of said plurality of laser devices.

3. The optically switched multiple output laser device of claim 2, further comprising:

a laser diode bias current regulator coupled to said modulation input device; and
a wavelength comparator coupled to said laser diode bias current regulator and said laser device.

4. The optically switched laser device of claim 3 further comprising:

a stable carrier wavelength reference.

5. The optically switched multiple output laser device of claim 1, further comprising:

a plurality of modulation devices, each of said modulation devices coupled to a corresponding one of said laser diode devices.

6. The optically switched multiple output laser device of claim 1, wherein the stable switched multifrequency source comprises:

a narrowband reflective optical filter bank comprising a plurality of narrowband reflective optical filter devices; and
an optical switch coupled to each of said plurality of said narrowband reflective optical filter devices.

7. The optically switched multiple output laser device of claim 1, wherein the switched multifrequency source further comprises:

a switch controller coupled to said optical switch.

8. The optically switched multiple output laser device of claim 1, wherein the switched multifrequency source further comprises:

a plurality of temperature control devices each coupled to a corresponding one of said narrowband reflective optical filter devices.

9. The optically switched multiple output laser device of claim 1, wherein each of said laser devices comprises:

a laser diode;
a thermo electric cooler coupled to said laser diode;
a thermistor coupled to said laser diode; and
a temperature control coupled to said thermo electric cooler and said thermistor.

10. The optically switched multiple output laser device of claim 9, wherein the laser diode comprises:

a light producing element; and a reflective output coupled to said light producing element.

11. An optically switched laser having a plurality of selectable resonant frequencies, the switched laser comprising:

at least one light producing element;

at least one narrow band reflective optical filter bank comprising a plurality of narrow band reflective optical filter devices for generating the frequencies; and at least one optical switch coupled to each of said narrow band reflective optical filter devices, wherein said optical switch receives a command signal to couple one of said optical filter devices to said light producing element.

12. The switched multifrequency source of claim 11, further comprising:

a switch controller coupled to said optical switch.

13. The switched multifrequency source of claim 11, further comprising:

a plurality of filter fine-tuning devices each coupled to a corresponding one of said narrow band reflective optical filter devices.

14. The switched laser of claim 11 further comprising:

temperature control means for regulating the temperature of said light producing element;

stable carrier wavelength reference means for referencing one of the plurality of selectable resonant frequencies; and feedback means, connected to each of said plurality of narrow band reflective optical filter devices for stabilizing the referenced resonant frequency.

15. The switched multifrequency source of claim 11, further comprising:

reference signal feedback means for stabilizing the frequency of said narrow band reflective optical filter devices.

16. An optically switched laser device for selectably generating at least one desired frequency from a plurality of selectable frequencies, the device comprising:

a plurality of wavelength selective reflective devices forming at least one optical filter bank;

a plurality of light producing devices; and a plurality of optical switches, wherein each of said plurality of optical switches receives a command signal to couple each of said plurality of light producing devices to one of said plurality of wavelength selective reflective devices.

17. An optically switched laser device operating at any one of a plurality of resonant frequencies, comprising:

a plurality of wavelength selective reflective devices, wherein each reflective device provides a reference for establishing the operating resonant frequency;

at least one laser device for generating light at the opening resonant frequency; and at least one optical switch for selectively coupling said laser device to at least one of said plurality of wavelength selective reflective devices in response to receiving a command signal.

18. The optically switched laser device of claim 17 further comprising:

reference signal feedback means for stabilizing the frequency of at least the wavelength selective reflective device to which said laser device is coupled.

19. The optically switched laser device of claim 17 further comprising:

a laser diode;

a thermo electric cooler coupled to said laser diode;

a thermistor coupled to said laser diode; and a temperature control coupled to said thermo electric cooler and said thermistor.

20. The optically switched laser device of claim 17 wherein said plurality of wavelength selective reflective device comprises:

a narrow band reflective optical filter bank comprising a plurality of narrow band reflective optical filter devices.

21. The optically switched laser device of claim 20 further comprising:

a plurality of filter fine tuning devices each coupled to a corresponding one of said narrow band reflective optical filter devices.

22. The optically switched laser device of claim 17 further comprising:

a switch controller coupled to said optical switch.

23. The optically switched laser device of claim 17 wherein the laser device comprises:

a light producing element; and a reflective output device coupled to said light producing element.

24. The optically switched laser device of claim 17, further comprising:

a modulation device coupled to said laser device;

a laser diode bias current regulator coupled to said modulation device; and a wavelength comparator coupled to said laser diode bias current regulator and said laser device.

25. The optically switched laser device of claim 17, further comprising:

a stable carrier wavelength reference.

26. A method of providing a multifrequency optical signal source, comprising the steps of;

arranging a plurality of wavelength selective reflective devices to form an optical filter bank;

optically coupling one of said plurality of wavelength selective reflective devices to a light producing element through an optical switch responsive to a control signal;

selectively controlling said light producing element to alter the resonate, response of the source.

27. The method of claim 26 comprising the additional step of modulating an output of said a light producing element.

28. A method of switching among multiple frequencies of light comprising the steps of:

optically coupling one of a plurality of wavelength selective reflecting means for reflecting an optical signal at a plurality of wavelengths within a range of frequencies through an optical switch to a light producing means; and selectively switching said optical switch in response to a control signal to provide a desired frequency of light output from said light producing means.

* * * * *